United States Patent [19]
Shelton

[11] Patent Number: 5,653,851
[45] Date of Patent: Aug. 5, 1997

[54] METHOD AND APPARATUS FOR ETCHING TITANATE WITH ORGANIC ACID REAGENTS

[75] Inventor: Gail D. Shelton, Mesquite, Tex.

[73] Assignee: Texas Instruments Incorporated, Dallas, Tex.

[21] Appl. No.: 270,870

[22] Filed: Jul. 5, 1994

[51] Int. Cl.$^6$ .................................................. H01L 21/302
[52] U.S. Cl. .................................................. 216/67; 216/76
[58] Field of Search ........................... 156/643.1, 646.1; 216/63, 67, 76

[56] References Cited

U.S. PATENT DOCUMENTS

| | | | |
|---|---|---|---|
| 3,642,527 | 2/1972 | Purdes et al. | 117/212 |
| 3,676,455 | 7/1972 | Haug et al. | 260/309.5 |
| 3,754,987 | 8/1973 | Purdes | 117/212 |
| 3,846,820 | 11/1974 | Lampe et al. | 357/31 |
| 4,018,608 | 4/1977 | Frazier | 96/27 |
| 4,080,532 | 3/1978 | Hopper | 250/332 |
| 4,142,207 | 2/1979 | McCormack et al. | 358/113 |
| 4,143,269 | 3/1979 | McCormack et al. | 250/352 |
| 4,162,402 | 7/1979 | Hopper | 250/332 |
| 4,205,227 | 5/1980 | Reed | 250/330 |
| 4,275,302 | 6/1981 | Imbert et al. | 250/330 |
| 4,379,232 | 4/1983 | Hopper | 250/332 |
| 4,401,054 | 8/1983 | Matsuo et al. | 118/723 |
| 4,594,507 | 6/1986 | Elliott et al. | 250/331 |
| 4,705,361 | 11/1987 | Frazier et al. | 350/355 |
| 4,751,387 | 6/1988 | Robillard | 250/331 |
| 4,876,983 | 10/1989 | Fukuda et al. | 118/722 |
| 4,994,672 | 2/1991 | Cross et al. | 250/330 |
| 5,010,251 | 4/1991 | Grinberg et al. | 250/332 |
| 5,021,663 | 6/1991 | Hornbeck | 250/349 |
| 5,047,644 | 9/1991 | Meissner et al. | 250/332 |
| 5,051,591 | 9/1991 | Trotta et al. | 250/351 |
| 5,196,703 | 3/1993 | Keenan | 250/332 |
| 5,201,989 | 4/1993 | Douglas et al. | |
| 5,238,530 | 8/1993 | Douglas et al. | 156/635 |
| 5,242,537 | 9/1993 | Nelson | 156/643 |
| 5,262,001 | 11/1993 | Takehara | 156/643 |
| 5,264,326 | 11/1993 | Meissner et al. | 430/313 |
| 5,298,112 | 3/1994 | Hayasaka et al. | 156/643 |
| 5,366,802 | 11/1994 | Nelson | 428/336 |
| 5,382,320 | 1/1995 | Desu et al. | 156/667 |
| 5,395,482 | 3/1995 | Onda et al. | 156/646 |
| 5,415,728 | 5/1995 | Hasegawa et al. | 156/643.1 |

FOREIGN PATENT DOCUMENTS

| | | |
|---|---|---|
| 197806 | of 1976 | Germany. |
| 63078533 | 3/1986 | Japan. |
| 2251952 | of 1992 | United Kingdom. |
| WO9116607 | of 1991 | WIPO. |

OTHER PUBLICATIONS

Divisional USSN 08/473,639 filed Jun. 7, 1995 by Gail D. Shelton, entitled "Method and Apparatus for Etching Titanate with Organic Acid Reagents."

"Reactive Ion Etching of Sputtered PbZr$_{1-x}$Ti$_x$O$_3$ Thin Films"; Japanese Journal of Applied Physics; vol. 31; No. 9A; Sep. 1992; Saito et al.; pp. 1260–1262.

"Reactive Ion Etching of Lead Zirconate Titanate (PZT) Thin Film Capacitors"; J. Electrochemical Society, vol. 140, No. 9, Jan. 1993, Vijay et al.; pp. 2635–2639.

Rousseau, Francois, et al., *New Approaches for Dry Etching Metal Oxides at Low Temperature and High Rates*, paper submitted at the Chemistry Department University of New Mexico, Albuquerque, NM 87131, pp. 1–6.

(List continued on next page.)

*Primary Examiner*—Nam Nguyen
*Assistant Examiner*—George Goudreau
*Attorney, Agent, or Firm*—Brian A. Carlson; Richard A. Stoltz; Richard L. Donaldson

[57] ABSTRACT

A method to anisotropically etch a titanate wafer (16 or 39) is provided. The method includes the steps of generating a plasma (32) and mixing an organic acid reagent with the plasma (32). The titanate wafer (16 or 39) is then exposed to the plasma (32) and organic acid reagent mixture thereby etching (42) the titanate wafer (16 or 39).

11 Claims, 1 Drawing Sheet

OTHER PUBLICATIONS

Rousseau, Francois, et al., *Low–Temperature Dry Etching of Metal Oxides and ZnS Via Formation of Volatile Metal B–diketonate Complexes*, Materials Chemistry Communications, paper submitted to J. Mater, May 29, 1992, pp. 1–6.

PlasmaQuest, *Electron Cyclotron Resonance: At the Cusp of a Technology Shift*, paper prepared by PlasmaQuest, Inc. 850 N. Dorothy, Suite 504, Richardson, Texas 75081, vol. 6, No. 1.

R. A. Wood, "HIDAD–A Monolithic, Silicon, Uncooled Infrared Imaging Focal Plane Array," *HIDAD*, date unknown, pp. 579–581.

METHOD AND APPARATUS FOR ETCHING TITANATE WITH ORGANIC ACID REAGENTS

CROSS REFERENCE TO RELATED APPLICATIONS

This application is related to copending U.S. patent application Ser. No. 08/367,641, filed Jan. 3, 1995, by Howard R. Beratan, et al.; copending U.S. patent application Ser. No. 08/363,068, filed Jan. 3, 1995, by James F. Belcher, et al.; and copending U.S. patent application Ser. No. 08/367,659, filed Jan. 3, 1995, by James F. Belcher, et al.; all assigned to the Assignee of the present application, TEXAS INSTRUMENTS INCORPORATED.

TECHNICAL FIELD OF THE INVENTION

This invention relates in general to the field of semiconductor processing, and more particularly to a method and apparatus for etching titanate with organic acid reagents.

BACKGROUND OF THE INVENTION

Titanate materials offer useful electrical, optical, and mechanical properties. One use for titanate is in forming thermal sensors in thermal imaging systems to detect infrared radiation and to produce an image capable of being visualized by the human eye. These thermal sensors are generally formed by defining a plurality of sensors in bulk titanate by an etching process.

Previously developed methods for etching titanate substrates have generally involved isotropic wet chemical processes. Wet etching processes may suffer from several disadvantages. Wet chemical processes may etch isotopically in all directions and can lead to undercutting of masking material. This can limit the dimensions achievable through wet etching to relatively large structures. Wet chemical etching a titanate substrate can also contaminate the titanate. Additionally, wet chemical etching processes do not always integrate well into large quantity production lines and may result in liquid waste streams that require expensive disposal procedures and techniques.

Dry or anisotropic etching processes for titanate substrates have also been previously developed. These dry etching processes typically require extreme conditions of either temperature, laser light, or ion bombardment. These dry etching processes generally rely on high temperature or chemical approaches that may be incompatible with standard photoresist technology. For example, reactive ion etching (RIE) may require temperatures above 500° C. that can damage the photoresist of the lithographic process as well as the titanate substrate.

Laser-based etching of a titanate substrate can damage the titanate substrate being etched. Laser-based etching of a titanate substrate also suffers from limited throughput as the area being etched is limited to the area of the substrate contacted by the laser. While etching a titanate material substrate by laser scribing generally results in less undercutting of the substrate, the laser radiation may damage the titanate substrate requiring repair by a high temperature (approximately 1,400° C.) anneal. This anneal may produce undesirable oxidation states in the titanate substrate, reducing its desired electrical, optical, or mechanical properties. High temperature anneals, in addition, can cause changes and damage to other materials and structures present in a substrate.

Etching a titanate substrate by ion-milling can generate unacceptable defects in the titanate. These defects may include changes in a titanate's electrical, chemical, mechanical, optical, and/or magnetic properties.

Another anisotropic dry etching process previously developed includes using organic acid reagents to etch a titanate substrate. In order to obtain suitable etch rates, laser inducement of the etching is required. The difficult operation and maintenance of a laser limits the use of this process to small quantities.

SUMMARY OF THE INVENTION

In accordance with the present invention, a method and apparatus are provided that substantially eliminate or reduce disadvantages and problems associated with previously developed titanate etching methods and apparatus.

A method used to etch a titanate substrate should generally do so without introducing damage that would unacceptably change the properties of the materials on which the function of the eventual devices depends. In addition, an anisotropic etch method is usually desired so that details in the etch mask pattern may be preserved. Contamination of the titanate material (and/or nearby materials) by the etch method usually cannot be tolerated.

One aspect of the present invention provides a method to anisotropically etch a titanate wafer. The titanate wafer may be mounted on or attached to other materials that will be used to form thermal sensors in a focal plane array (FPA). The method includes the steps of generating a plasma and mixing an organic acid reagent with the plasma. The titanate substrate may then be exposed to the plasma and organic acid reagent mixture thereby etching the titanate substrate.

Another aspect of the present invention provides an apparatus for etching a titanate substrate. The apparatus includes a reaction vessel having a support for holding the titanate substrate. The apparatus may also include a plasma generator for providing a plasma gas to the reaction vessel and a distribution device for delivering an organic acid reagent to the titanate. The plasma gas and reagent mix within the vessel thereby causing the reagent to etch the titanate wafer.

An important technical advantage of the present invention can include an anisotropic, non-destructive etching process for achieving small geometries and control of those geometries during the etching process of a titanate substrate. The present invention also eliminates the waste products associated with previously developed titanate wet etching processes.

Another technical advantage of the present invention is the lower temperatures (approximately <200° C.) at which etching may occur as opposed to previously developed titanate dry etching processes. Using the present method and apparatus, etching of titanate at as low as 100° C. may be achievable. This lower etching temperature minimizes possible thermal damage to the titanate and surrounding structures. This lower temperature also allows for bonding the titanate wafer to one or more infrared absorbing materials and for etching the titanate without damaging the infrared absorbing layers.

Yet another technical advantage of the present invention is that it is suitable for etching many types of titanate and can etch thin or thick titanate films at rates up to 1,000 Å per minute.

Another technical advantage of the present invention is that it can be implemented into a high quantity process for etching a single titanate wafer or multiple titanate wafers. The present invention can provide etch rates of up to 1,000 Å per minute. The present invention may be implemented using existing semiconductor processing equipment, thereby minimizing its capital costs.

BRIEF DESCRIPTION OF THE DRAWINGS

For a more complete understanding of the present invention and advantages thereof, reference is now made to the following description taken in conjunction with the accompanying drawings in which like reference numbers indicate like features and wherein.

DETAILED DESCRIPTION OF THE INVENTION

Figure 1:
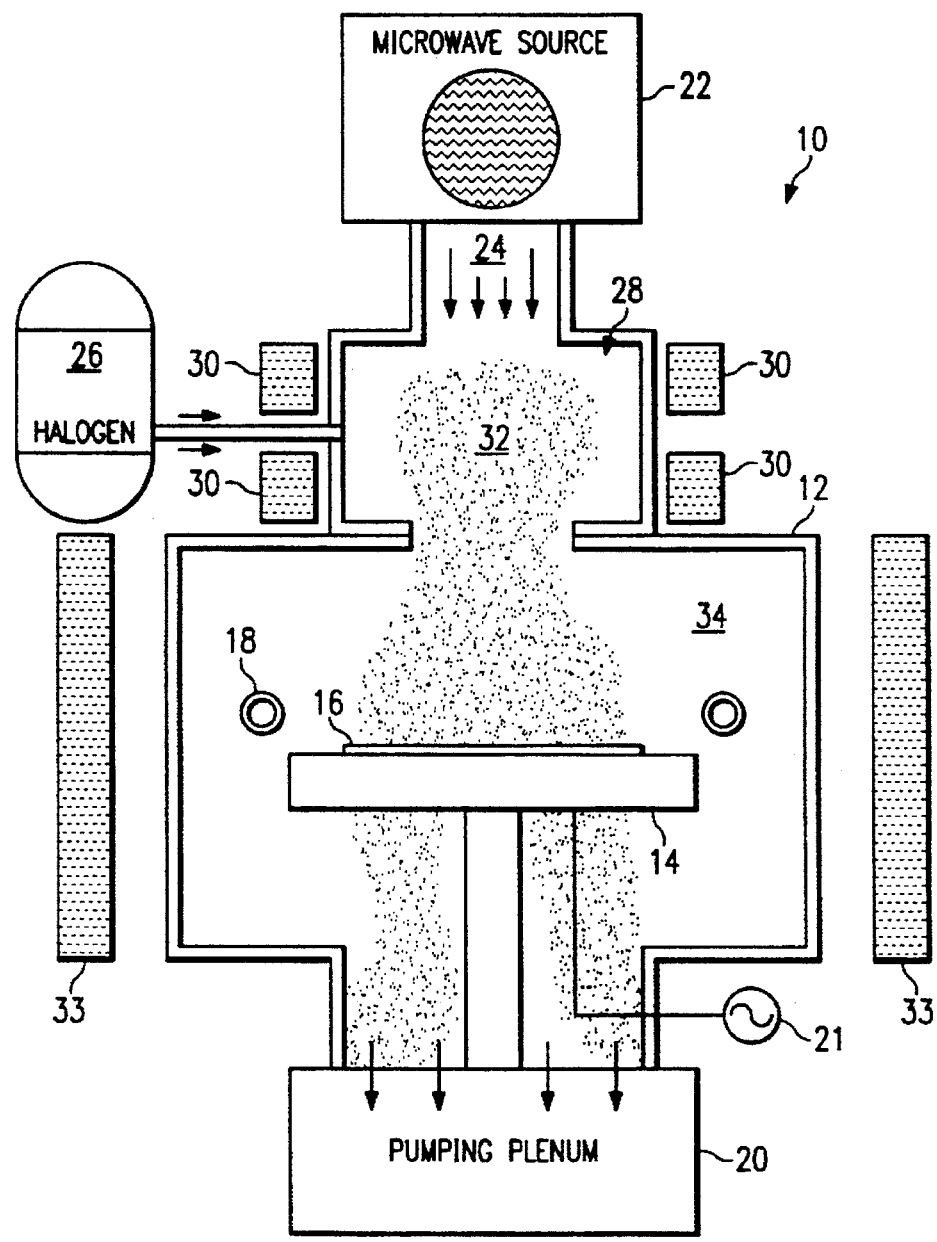
FIG. 1 illustrates an embodiment of a reaction chamber, in elevation with portions broken away, suitable for practicing the present invention.
Figure 2:
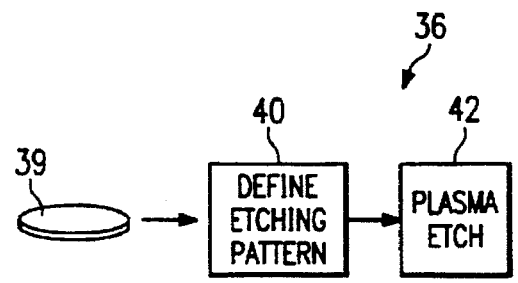
FIG. 2 depicts a process flow diagram incorporating aspects of the present invention.

Preferred embodiments of the present invention are illustrated in FIGS. 1 and 2, like numerals being used to refer to like and corresponding parts of the various drawings.

The present invention employs a reaction of an organic acid reagent in gaseous form with a solid titanate to form a volatile titanate-organic compound that exhibits significant vapor pressures at low temperatures. A by-product of the reaction is water vapor. The formation of the titanate-organic compound removes the titanate thereby resulting in etching of the titanate. This reaction may be represented by equations 1 and 2:

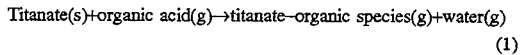

Titanate(s)+organic acid(g)→titanate-organic species(g)+water(g)  (1)

or

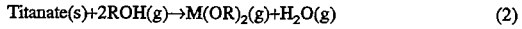

Titanate(s)+2ROH(g)→M(OR)$_2$(g)+H$_2$O(g)  (2)

The titanates that may be etched by this process include, but are not limited to, barium strontium titanate (BST), barium titanate (BT), calcium titanate (CT), strontium titanate (ST), and any material in the lead titanate family, including lead titanate (PT), lead lanthanum zirconium titanate (PZLT), lead zirconate titanate (PZT).

The organic acid reagent for the reaction represented in Equations 1 and 2 should have a low pK$_a$ value, should possess more than one donor functional group to aid steric and electronic saturation at the titanate center in the final titanate-organic product, should be highly volatile with the corresponding titanate-organic complex having significant vapor pressure at elevated temperatures (~200° C.), and the titanate-organic product should be kinetically inert at the reaction temperature. The organic acid reagent that may be used includes, but is not limited to, β-diketones. β-diketones include, for example, 1,1,1,5,5,5-hexafluoro-2,4-pentanedione (1,1,1,5,5,5-hexafluoroacetylacetone), hereinafter "hfacH".

Using BST as the titanate to be etched, Equations 1 and 2 can be represented by Equation 3:

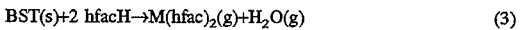

BST(s)+2 hfacH→M(hfac)$_2$(g)+H$_2$O(g)  (3)

In order to increase the etch rate of the titanate, a downstream plasma may be introduced to the reaction represented by Equations 1–3. The energy of the plasma increases the rate the organic acid reagent etches the titanate.

Hereinafter, the organic acid reagent referred to shall be hfacH, it being understood that the exact composition of the organic acid reagent may be varied without departing from the inventive concepts of the present invention.

FIG. 1 shows in cross-section and in elevation an exemplary reaction chamber for etching a titanate wafer with hfacH. In FIG. 1, reaction chamber 10 includes vessel 12 that is generally a vacuum-sealed container. Within vessel 12 is wafer chuck 14 that is used to support titanate wafer 16 during the etching process. Titanate wafer 16 may be a single wafer or multiple wafers. Also, titanate wafer 16 may be attached or mounted on various substrates as desired to form a thermal sensor.

Also within vessel 12 is gas distribution ring 18 located just above titanate wafer 16 and chuck 14. Gas distribution ring 18 introduces the hfacH into vessel 12. Reaction chamber 10 also includes pumping plenum 20 that evacuates vessel 12 and draws the gases within vessel 12 over titanate wafer 16.

Reaction chamber 10 may also include radio frequency (RF) energy source 21 electrically coupled to chuck 14 and titanate wafer 16. By providing RF energy through titanate wafer 16, the etching rate of titanate wafer 16 can be increased.

In order to enhance the reaction of hfacH with titanate wafer 16, a plasma is generated within reaction chamber 10. Reaction chamber 10 of FIG. 1 may include an electron cyclotron resonance (ECR) plasma reactor. An ECR plasma reactor sold by PlasmaQuest of Richardson, Tex., model number 357-R may be suitable for reaction chamber 10. The operation of plasma reactors, including ECR plasma reactors, is well known in the art and need not be provided in detail in order to fully describe the present invention. A summary, however, of the components and operation of reaction chamber 10 is provided.

Reaction chamber 10 may include microwave source 22, for example, at 2.45 gigahertz, that introduces microwave power into vessel 12 at inlet 24. Typically, halogen gas 26, such as chlorine, fluorine, or boron, is introduced into downstream portion 28 of vessel 12. Microwave power from microwave source 22 ionizes halogen gas 26 achieving a plasma state in halogen gas 26 in downstream portion 28 of vessel 12. Electromagnets 30 located external to vessel 12 help contain and shape plasma gas 32. Additionally, reaction chamber 10 may also include permanent magnets 33 external to central portion 34 of vessel 12 to provide uniformity in, direct the flow of, and control the configuration of plasma gas 32 while in vessel 12.

In operation of reaction chamber 10, titanate wafer 16 is placed in vessel 12 on chuck 14. The temperature within vessel 12 can be regulated with a heat source (not explicitly shown), such as, for example, a tungsten-halogen heating lamp. Typically, temperatures of approximately 200° C. are appropriate for etching titanates in accordance with the present invention. Pumping plenum 20 then evacuates vessel 20 to, for example, approximately 1 mtorr. Once the pressure is at a sufficiently low level, microwave source 22 provides microwave power to downstream portion 28 of vessel 12 simultaneously with the injection of halogen gas 26. The microwave power ionizes halogen 26 causing plasma gas 32 to form in downstream portion 28. Magnets 30 define and shape plasma gas 32.

Once plasma gas 32 is formed in downstream portion 28, gas distribution ring 18 injects the hfacH reagent at the surface of titanate wafer 16. Pumping plenum 20, along with magnets 30 and 33, cause plasma gas 32 to move into central portion 34 and towards titanate wafer 16. Plasma gas 32 energizes the hfacH provided by gas distribution ring 18. The energy from plasma gas 32 enhances the reaction of the hfacH with titanate wafer 16. In an alternate embodiment of the present invention, plasma gas 32 may be generated in center portion 34 of vessel 12 instead of at downstream portion 28. The energized hfacH reacts with titanate wafer 16 in accordance with Equation (1)–(3) thereby causing titanate wafer 16 to be etched.

Pumping plenum 20 continually draws plasma gas 32 and hfacH from gas distribution ring 18 across titanate wafer 16 until the desired amount of etching is achieved. Pumping plenum 20 also withdraws the products of the reaction occurring between titanate wafer 16 and hfacH away from titanate wafer 16.

It is noted that, generally, increasing the microwave power provided by microwave source 22, the rate hfacH is provided by distribution ring 18, and the pumping speed of pumping plenum 20, increases the etch rate of titanate wafer 16. Additionally, applying RF power 21 to chuck 14 and titanate wafer 16 can also increase the etch rate of titanate wafer 16.

By applying the reaction represented in Equations (1)–(3) in reaction chamber 10 of FIG. 1, etch rates of up to 1,000 Å per minute of titanate may be achieved. Etching titanate wafer 16 by the described method may occur at temperatures below approximately 200° C. and as low as 100° C. This provides a technical advantage of eliminating exposing the titanate and any attached substrates to sometimes damaging higher temperatures. This lower temperature also allows for bonding the titanate wafer to one or more infrared absorbing materials and for etching the titanate without damaging the infrared absorbing layers.

While FIG. 1 provides a possible reaction chamber for practicing the present invention, it is understood that numerous modifications and alterations may be made without departing from the inventive concepts of the present invention. In particular, the operation of reaction chamber 10 may be programmed into and controlled by a process control computer. Using a process control computer would allow for automating significant portions of the etching process described.

FIG. 2 illustrates a flow diagram for processing titanate in accordance with concepts embodying the present invention. Process flow 36 begins at step 38 with titanate substrate 39. An etching pattern is then defined on titanate substrate 39 at step 40. Defining an etching pattern on titanate substrate 39 may be by photolithographic processes that are well known in the art. Polyimide, nichrome, or spin-on glass (SOG) photoresist are examples of the types of materials that may be used to define the etch pattern at step 40. At step 42, the unmasked portions of titanate substrate 39 are etched in, for example, reaction chamber 10 of FIG. 1.

In operation of the present invention, titanate substrates may be anisotropically plasma etched with an organic acid reagent. The present etching process can provide for small geometries, high etch rates, and is suitable for production quantities.

By the process described herein, a BST substrate may be etched to form thermal sensors in a focal plane array of a thermal detector. Examples of the type of thermal detectors that may be formed by the present method and apparatus are disclosed in U.S. Pat. No. 4,080,532, entitled "Ferroelectric Imaging System"; U.S. Pat. No. 4,162,402, entitled "Ferroelectric Imaging System"; and U.S. Pat. No. 5,021,663, entitled "Infrared Detector." These patents are expressly incorporated by reference herein.

The present invention provides a method and apparatus for etching titanate having numerous technical advantages. A few of the technical advantages include an anisotropically etching process that occurs at lower temperatures, e.g., 200° Celsius, that provides for a high degree of selectivity, and uses standard commercially available processes and equipment.

Although the present invention has been described in detail, it should be understood that various changes, substitutions, and alterations can be made hereto without departing from the spirit and scope of the invention as defined by the appended claims.

What is claimed is:

1. A method to anisotropically etch a titanate wafer comprising the steps of:

generating a plasma;

mixing an organic acid reagent comprising a β-diketone with the plasma; and exposing the titanate wafer to the plasma and organic acid reagent mixture thereby etching the titanate wafer.

2. A method to anisotropically etch a titanate wafer for use in fabricating thermal sensors, the method comprising the steps of:

defining an etching mask on a surface of the titanate wafer;

generating a plasma in an electron cyclotron resonance (ECR) plasma generator;

mixing an organic acid reagent of β-diketone with the plasma;

providing RF power to the titanate wafer; and exposing the titanate wafer to the plasma and organic acid reagent mixture thereby etching the unmasked surface of the titanate wafer.

3. A method to anisotropically etch a titanate wafer comprising the steps of:

generating a plasma;

mixing an organic reagent with the plasma;

exposing the titanate wafer to the organic reagent and plasma mixture thereby etching the titanate wafer; and wherein the organic reagent further comprises hfacH.

4. The method of claim 1 wherein the generating a plasma step is accomplished in an electron cyclotron resonance (ECR) plasma reactor.

5. The method of claim 1 wherein the generating a plasma step occurs at a downstream location from the exposing step.

6. The method of claim 1 further comprising the step of defining an etching mask on a surface of the titanate wafer prior to the exposing step.

7. The method of claim 1 wherein the generating, mixing, and exposing steps occur at a temperature below 300° C.

8. The method of claim 1 wherein the titanate wafer is selected from the group consisting of barium strontium titanate, barium titanate, calcium titanate, strontium titanate, lead titanate, lead zirconium titanate, and lead zirconate titanate.

9. A method to anisotropically etch a titanate wafer comprising the steps of:

generating a plasma;

mixing an organic reagent with the plasma;

exposing the titanate wafer to the organic reagent and plasma mixture thereby etching the titanate wafer; and the organic reagent further comprises one of 1,1,1,5,5,5-hexafluoro-2,4-pentanedione (1,1,1,5,5,5-hexaflouracetylacetone).

10. The method of claim 1 further comprising the step of providing RF power to the titanate wafer during the exposing step.

11. The method of claim 2 wherein the titanate wafer is one of barium strontium titanate, barium titanate, calcium titanate, strontium titanate, lead titanate, lead zirconium titanate, and lead zirconate titanate, and wherein the titanate wafer is etched by the reaction represented by:

$$\text{Titanate}(s) + 2\text{ROH}(g) \rightarrow \text{M(OR)}_2(g) + \text{H}_2\text{O}(g).$$

* * * * *